(12) United States Patent
Kimura et al.

(10) Patent No.: US 6,618,405 B2
(45) Date of Patent: Sep. 9, 2003

(54) SEMICONDUCTOR LASER MODULE AND AMPLIFIER USING THE MODULE

(75) Inventors: Toshio Kimura, Tokyo (JP); Tomoya Kato, Tokyo (JP); Yutaka Oki, Tokyo (JP)

(73) Assignee: The Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 09/985,008

(22) Filed: Nov. 1, 2001

(65) Prior Publication Data

US 2002/0093998 A1 Jul. 18, 2002

(30) Foreign Application Priority Data

Nov. 2, 2000 (JP) ........................................ 2000-336254

(51) Int. Cl.[7] .............................. H01S 5/022; H01S 5/14
(52) U.S. Cl. ............................ 372/36; 372/102; 385/88
(58) Field of Search ............................. 372/36, 92, 102

(56) References Cited

U.S. PATENT DOCUMENTS

| | | | |
|---|---|---|---|
| 5,832,011 A | 11/1998 | Kashyap | 372/23 |
| 6,058,131 A | 5/2000 | Pan | 372/102 |
| 6,233,045 B1 | 5/2001 | Suni et al. | 356/28.5 |
| 6,273,620 B1 * | 8/2001 | Kato et al. | 385/88 |
| 6,310,997 B1 | 10/2001 | Kato et al. | 385/37 |
| 6,394,665 B1 * | 5/2002 | Hayashi | 385/88 |
| 6,415,078 B1 * | 7/2002 | Shigehara et al. | 385/37 |

* cited by examiner

Primary Examiner—James Davie
(74) Attorney, Agent, or Firm—Oblon, Spivak, McClelland, Maier & Neustadt, P.C.

(57) ABSTRACT

In a semiconductor pumping light source module according to the present invention, a fiber grating (FBG) is disposed, outside a ferrule, in an optical fiber that is inside a protective tube to define a cavity between the FBG and the semiconductor laser device. The FBG is disposed, outside the ferrule, in the optical fiber that is inside the protective tube inside a protective boot. The FBG is disposed on the optical fiber at a portion where no adhesive exists inside the protective tube. The semiconductor pumping light source module is used as a pumping light source of the optical amplifier. The semiconductor pumping light source is also used as the pumping light source of a Raman amplifier.

8 Claims, 5 Drawing Sheets

SEMICONDUCTOR LASER MODULE AND AMPLIFIER USING THE MODULE

BACKGROUND OF THE INVENTION

1. Field of the Invention

The present invention relates to a semiconductor laser module which is capable of being employed as a pumping light source of an optical amplifier, and an optical amplifier which is capable of being employed in optical communication.

2. Description of the Related Art

In existing optical fiber communication systems, there have been frequently employed rare earth doped fiber amplifiers representatively including an erbium doped optical fiber amplifier to which erbium (Er) has been added (hereinafter referred to as "EDFA"). In recent years, a Raman amplifier using Raman amplification action has also been employed.

As a pumping light source used in an optical amplifier, there has been employed a semiconductor laser module of a high output which stabilizes the wavelength by a fiber grating (FBG).

One of the semiconductor laser modules with the FBG is shown in FIG. 5. A laser beam emitted from a semiconductor laser device A is converted into a collimated light beam through a first lens B, and the collimated light beam is condensed onto an input end face of an optical fiber D through a second lens C, to thereby optically couple the semiconductor laser device A with the optical fiber D. The optical fiber D is formed with a fiber grating E that reflects only a light beam having a predetermined wavelength. In the semiconductor laser module shown in FIG. 5, a Peltier device P for temperature control is disposed within a package F, a base K is disposed on the Peltier device P, and a photodiode PD for monitoring, a thermister S and the semiconductor laser device A are mounted on the base K.

As shown in FIG. 6, the FBG of the semiconductor laser module shown in FIG. 5 has, for example, a reflectivity spectrum whose peak reflectivity is about 4% and whose full width half maximum (FWHM) is 2 nm, and feeds back only a part of the laser beam coupled with the optical fiber D to the semiconductor laser device A. Because a loss of the external resonator made up of the semiconductor laser device A and the FBG becomes smaller at only the center wavelength of the FBG, even in the case where a driving current or an ambient temperature of the semiconductor laser device A changes, the oscillation wavelength of the semiconductor laser device A is fixed at the above center wave.

The semiconductor laser module with the FBG is shown in FIG. 7. This semiconductor laser module is so designed as to provide the FBG in a ferrule F into which the optical fiber D is fixedly inserted. In FIG. 7, a protective tube I disposed outside the optical fiber D and a protective boot H disposed outside the protective tube I are also shown.

SUMMARY OF THE INVENTION

In order to achieve the above object, according to a first aspect of the present invention, there is provided a semiconductor laser module having a ferrule at a light input side leading end of an optical fiber that receives a light outputted from a semiconductor laser device and transmits the light, wherein an FBG is disposed, outside the ferrule, on the optical fiber inside a protective tube, and a cavity is defined between the FBG and the semiconductor laser device.

According to a second aspect of the present invention, there is provided a semiconductor laser module having a ferrule at a light input side leading end of an optical fiber that receives a light outputted from a semiconductor laser device and transmits the light, wherein an FBG is disposed, outside the ferrule, on the optical fiber inside a protective tube that is disposed inside a protective boot, and a cavity is defined between the FBG and the semiconductor laser device.

According to a third aspect of the present invention, in the semiconductor laser module according to the first or second aspect of the present invention, the FBG is formed inside the protective tube and on the optical fiber at a portion where no adhesive exists.

An optical amplifier according to the present invention uses the semiconductor laser module as defined in any one of the above first to third aspects of the present invention as a pumping light source.

BRIEF DESCRIPTION OF THE DRAWINGS

These and other objects and advantages of this invention will become more fully apparent from the following detailed description taken with the accompanying drawings in which.

DETAILED DESCRIPTION

Now, a description will be given in more detail of preferred embodiments of the present invention with reference to the accompanying drawings.

(First Embodiment of Semiconductor Laser Module)

Figure 1:
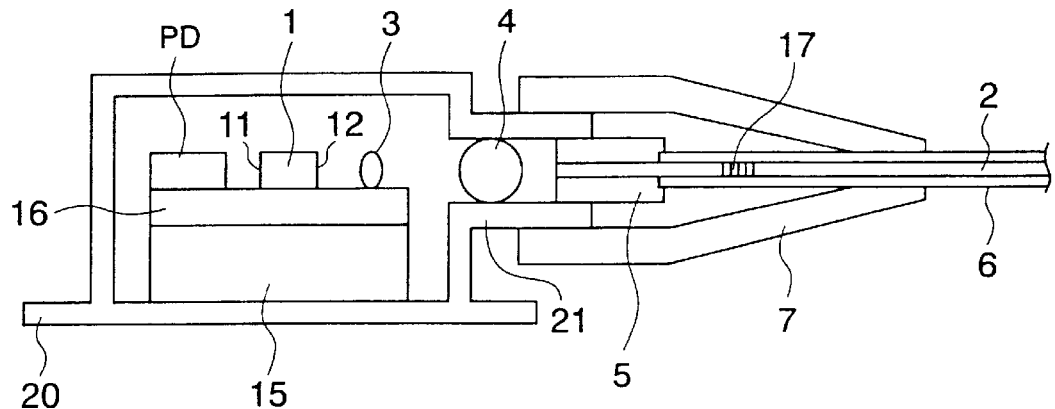
FIG. 1 is a side view showing the outline of an example of a semiconductor laser module in accordance with the present invention.

A semiconductor laser module according to a first embodiment of the present invention is shown in FIG. 1.

The semiconductor laser module includes a photodiode (PD) for monitoring, a semiconductor laser device 1, and a first lens (collimating lens) 3 which converts a laser beam emitted from the semiconductor laser device 1 into a collimated beam within a package 20. Among those components, the PD, the semiconductor laser device 1 and the collimating lens 3 are mounted on a base 16 whose temperature is controlled by a Peltier device 15. A fitting portion 21 is projected from the package 20, and a second lens (condenser) 4 that condenses the laser beam that has been collimated by the collimating lens 33 is received within the fitting portion 21. A ferrule 5 into which an optical fiber 2 is inserted and connected is fixedly inserted into the front portion of the fitting portion 21. With the above structure, the PD, the semiconductor laser device 1, the collimating lens 3, the condenser 4, the ferrule 5 and the optical fiber 2 are disposed in a line on an optical axis. The optical fiber 2 is provided with a fiber grating (FBG) 17. The FBG 17 is disposed, outside the ferrule 5, inside a protective tube 6 that covers the optical fiber 2, and inside a protective boot 7 that extends from the outside the protective tube 6 to the fitting portion 21 of the package 20 so as to cover the said parts. No adhesive for fixedly adhering the optical fiber 2 to the ferrule 5 exists at a position where the FBG is formed. Two or more FBGs 17 may be formed, and those FBGs 17 may be identical or slightly different in the reflection center wavelength.

(Second Embodiment of Semiconductor Laser Module)

Figure 2:
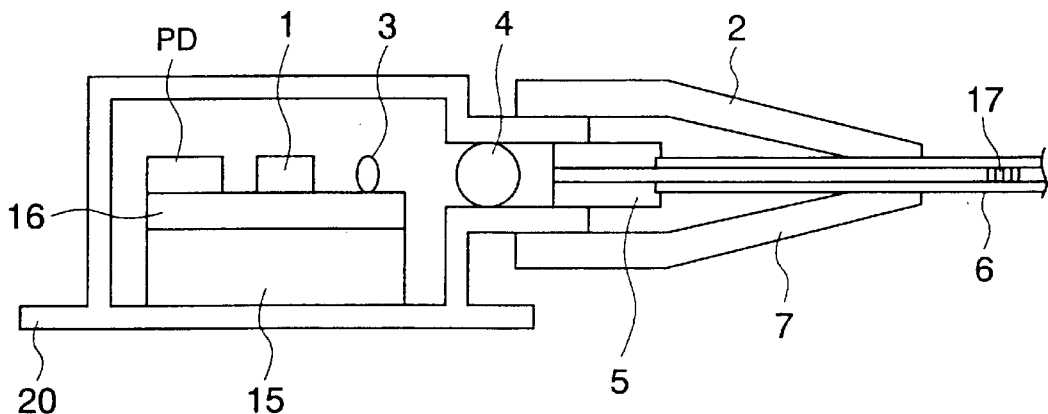
FIG. 2 is a side view showing the outline of another example of a semiconductor laser module in accordance with the present invention.

A semiconductor laser module in accordance with a second embodiment of the present invention is shown in FIG. 2. The basic structure of the semiconductor laser module is identical with that shown in FIG. 1, and different from FIG. 1 in that the FBG 17 is formed at a position of the optical fiber 2, outside the ferrule 5, within the protective tube 6 which is outside the protective boot 7. Similarly, no adhesive for fixedly adhering the optical fiber 2 to the ferrule 5 exists at that position where the FBG 17 is formed. Likewise, in FIG. 2, two or more FBGs 17 may be formed, and those FBGs 17 may be identical or slightly different in the reflection center wavelength.

Among the components in FIGS. 1 and 2, a high reflection coating (HR coating) 11 is coated on a rear end face of the semiconductor laser device 1, and an antireflection coating (AR film) 12 is coated on a front end face of the semiconductor laser device 11. In order obtain a higher output laser beam from the front end face of the semiconductor laser device 1, the reflectivity of the HR coating 11 is set to, for example, 90% or more, and the reflectivity of the AR coating 12 is set to, for example, 5% or less.

A dielectric multilayer coating is suitable for the HR coating and the AR coating. The dielectric multilayer coating may be made of the combination of $Ta_2O_5$ and $SiO_2$, $TiO_2$ and $SiO_2$, $Al_2O_3$ and $SiO_2$, and soon. In FIGS. 1 and 2, an external resonator (cavity) is made up of the rear end face of the semiconductor laser device 1 and the FBG 7. The cavity length of the cavity is adjustable by changing a position of the semiconductor laser device 1 or the FBG 17, and its length is an optical path length which is preferably set to 75 mm or less.

The existing components can be employed for the PD, the collimating lens 3, and the condenser 4 shown in FIGS. 1 and 2, respectively. For example, an aspherical lens, a ball lens, a distributed refractive lens or a plano-convex lens may be employed for the collimating lens 3. Those focal distances f are suitably set to 0.4 to 2 mm (normally f=about 0.7 to 0.8 mm). Antireflection coatings (AR coatings) are formed on both of the front and rear end faces of the collimating lens 3, respectively, and their reflectivity is preferably set to 0.5% or less. Likewise, an aspherical lens, a ball lens, a distributed refractive lens or a plano-convex lens may be employed for the condenser 4. Those focal distances f are suitably set to 1 to 5 mm (usually f=about 3 mm). Antireflection coatings (AR coatings) are formed on both of the front and rear end faces of the condenser 4, respectively, and their reflectivity is preferably set to 0.5% or less. The collimating lens 3 and the condenser 4 are related to the MFD NA of the semiconductor laser device 1 and the MFD·NA of the fiber.

The optical fiber 2 may be formed of a polarization maintaining fiber (PMF) other than a single mode optical fiber (SMF). It is preferable that the polarization maintaining axis of the PMF is made to coincide with the polarization direction of the laser. For the purpose of depolarizing, the polarization maintaining axis of the PMF may be inclined with respect to the polarization direction by 45 degrees. The input end face of the SMF may be so shaped as to be cut vertically or obliquely by 5 to 20 degrees (substancially, 6 to 8 degrees), or shaped into a leading spherical fiber. It is preferable that an antireflection coating 0.5 or less (in fact, 0.1%) in the reflectivity is disposed on the input end face, but the input end face may be kept to be obliquely cut without provision of the antireflection film.

A lens may be disposed or not disposed in front of the PD. In order to prevent the light beam inputted onto the PD from being reflected and then returned to the interior of the cavity, it is necessary to incline the PD.

(First Embodiment of Optical Amplifier)

Figure 3:
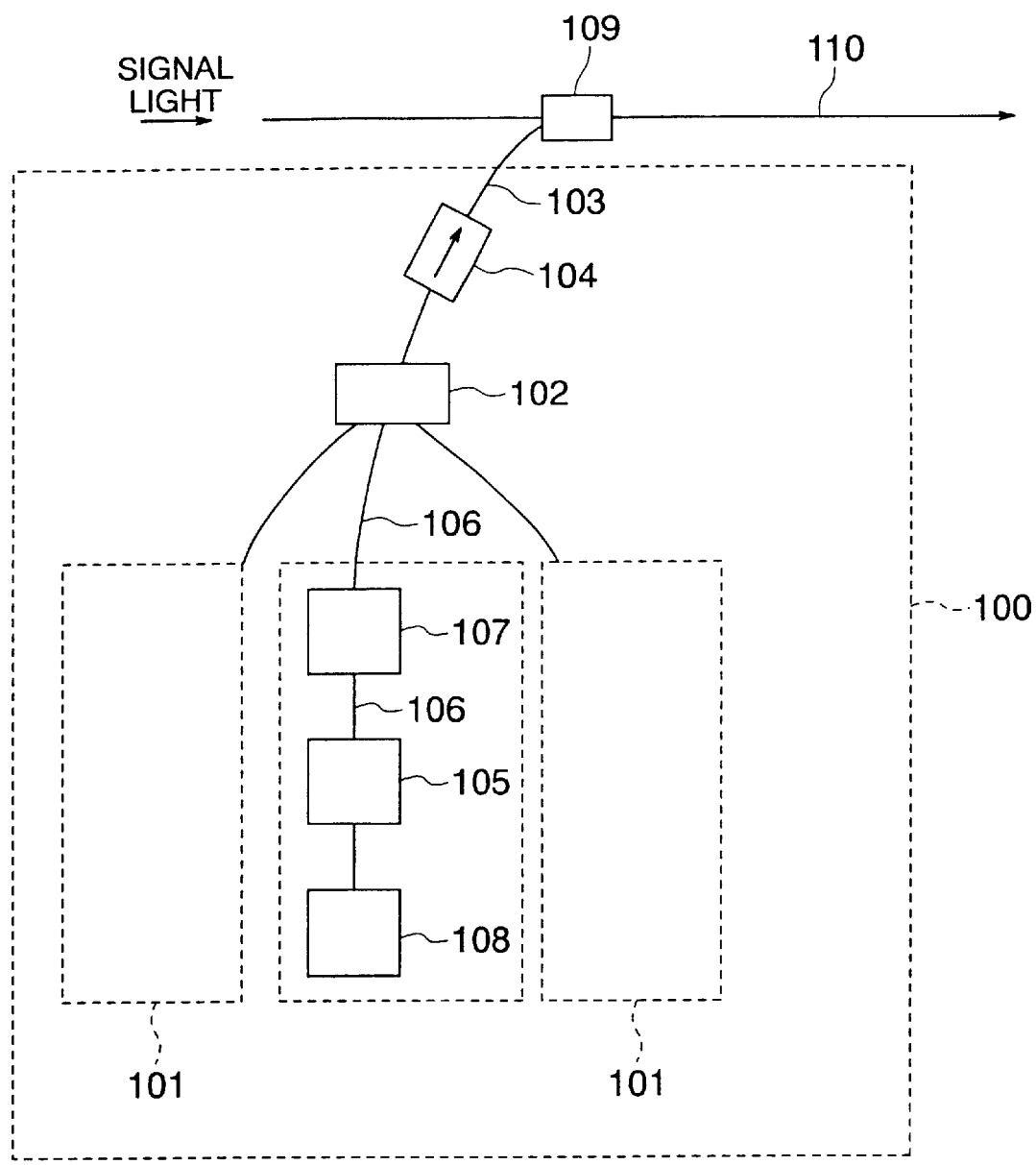
FIG. 3 is a side view showing the outline of an example of an optical amplifier in accordance with the present invention.

An example of the structure of an optical amplifier that uses the semiconductor laser module described in the above-mentioned first and second embodiments as a pumping light source module, a Raman amplifier in this embodiment is shown in FIG. 3. In FIG. 3, the Raman amplifier 100 is directed to an optical amplifier of a co-pumping method including a plurality of laser units 101 that output lights different in wavelength, a WDM coupler 102 that wavelength-multiplexes the lights outputted from the laser units 101, an optical fiber 103 that transmits the wavelength-multiplexed light, and an optical isolator of the polarization independent type which is disposed within the optical fiber 103.

Each of the laser units 101 includes the semiconductor laser module 105 described in any one of the above-mentioned respective embodiments, an optical fiber 106 that transmits the laser beam outputted from the semiconductor laser module 105, a depolarizer 107 formed of a PMF inserted into the optical fiber 106, and a control section 108.

The semiconductor laser module 105 outputs the laser beams different in wavelength from each other on the basis of the operation control of the semiconductor laser device by the control section 108, for example, the control of an inrush current or a Peltier module temperature.

According to the present inventors' study, the following characteristics are required for the semiconductor laser module 105 that serves as a pumping light source of the Raman amplifier. The semiconductor laser mode 105 according to the present invention is so set as to substantially satisfy the following required characteristics (1) to (9).

1) A noise of the pumping light is small:

The noise of the pumping light is −130 dB/Hz or less to −153 dB/Hz when a relative intensity noise (RIN) is in a range from 0 to 2 GHz (in a range from 0 to 22 GHz as occasion demands).

2) The degree of polarization (DOP) is small:

It is necessary that a coherent length is short, that is, a multimode is provided and it is easy to conduct depolarizing, or that no polarization occurs due to polarization multiplexing. The provision of the multimode may be satisfied by making at least three longitudinal modes, preferably four to five longitudinal modes enter within an oscillation spectrum (a width of a wavelength coming down from the peak of the spectrum by 3 dB).

3) The optical output is high:

The optical output of the semiconductor laser module is required to be 300 mW or more, and preferably 400 mW or more.

4) The wavelength stability is excellent:

Because a fluctuation of the oscillation wavelength leads to a fluctuation of the gain wavelength band, a technique for stabilizing a lazing wavelength due to a fiber grating, a DFB laser (distributed-feedback laser), a DBR laser (distributed brag reflector laser) or the like is required. It is necessary that the fluctuation width is, for example, within ±1 nm under all of driving conditions (an ambient temperature: 0 to 75° C., a driving current: 0 to 1 A).

5) The oscillation spectrums of the respective pumping laser modules are narrow:

If the oscillation spectrums of the respective pumping laser modules are too broad, the coupling loss of the wavelength multiplexing coupler becomes large, and the number of longitudinal modes contained within the spectrum width becomes large, as a result of which the longitudinal mode moves during oscillation, and the noise and gain may fluctuate. In order to prevent that drawback, it is necessary to set the oscillation spectrum to 2 nm or less, or 3 mm or less. If the oscillation spectrum is too narrow, a kink appears in the current to optical output characteristic, and a failure may occur in the control during laser driving. If at least three longitudinal modes, preferably four or five longitudinal modes enter in the oscillation spectrum as described in the above item 2), it is presumed that the coherency is reduced, thereby being liable to reduce the DOP.

6) The power consumption is low:

Because polarization multiplexing, wavelength multiplexing and so on are applied, a large number of pumping lasers are employed. As a result, the entire power consumption becomes large. It is necessary that the power consumption of the pumping laser module single substance is low.

7) No SBS (stimulated brillouin scattering) occurs:

When a higher optical output is concentrated in a narrow wavelength band due to the fiber grating or the like, the SBS occurs to deteriorate the pumping efficiency. From this viewpoint, the multimode (a plurality of longitudinal modes exist within the oscillation spectrum) is proper.

8) It is preferable to install the isolator:

In order to prevent the laser operation from being unstabilized due to a reflection light, it is preferable to dispose an isolator within the semiconductor laser module.

9) The temperature dependency does not exist or hardly exists:

Subsequently, the depolarizer 107 is, for example, a polarization maintaining fiber disposed on at least a part of the optical fiber 106, and its polarization maintaining axis is inclined by 45 degrees with respect to the polarization plane of the laser beam outputted from the semiconductor laser module 105. With this structure, the DOP of the laser beam outputted from the semiconductor laser module 105 is reduced to enable depolarization.

The optical isolator 104 allows the laser beam outputted from the semiconductor laser module 105 to pass therethrough and cuts the reflection light to the semiconductor laser module 105.

In the Raman amplifier 100 thus structured, after the DOP of the laser beam outputted from each of the semiconductor laser modules 105 has been reduced by the depolarizer 107, the laser beams different in wavelength are combined together by the WDM coupler 102, and then inputted into the optical fiber 110 through which a signal light is transmitted, from the optical fiber 103 through the isolator 104 by the WDM coupler 109.

The signal light within the optical fiber 110 is transmitted while being Raman-amplified by the inputted laser beam (pumping light).

In the Raman amplifier 100 of this embodiment, the use of the semiconductor laser module 105 and the laser unit 101 according to this embodiment stabilizes the Raman gain wavelength.

(Second Embodiment of the Optical Amplifier)

Figure 4:
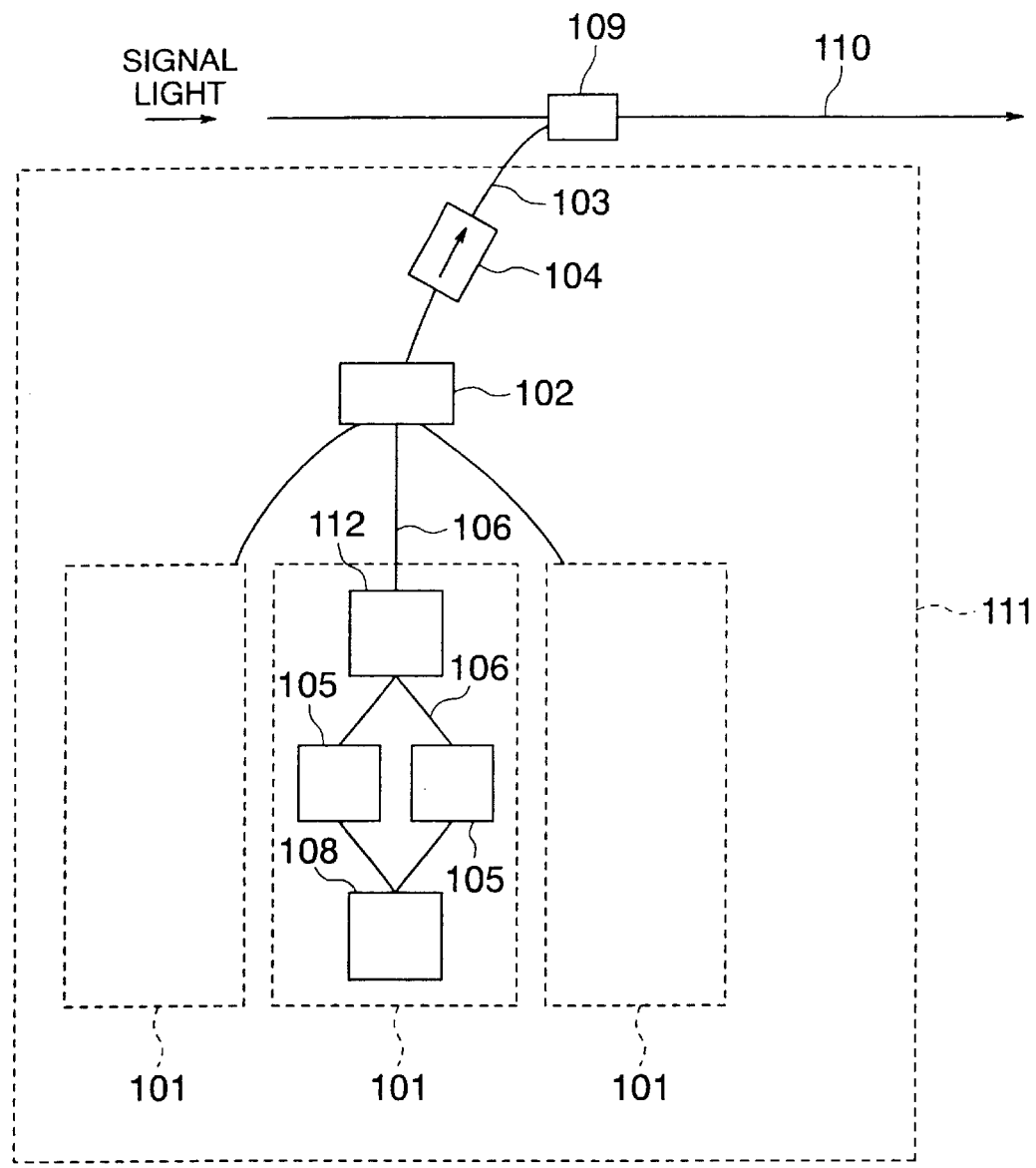
FIG. 4 is a side view showing the outline of another example of an optical amplifier in accordance with the present invention.
Figure 5:
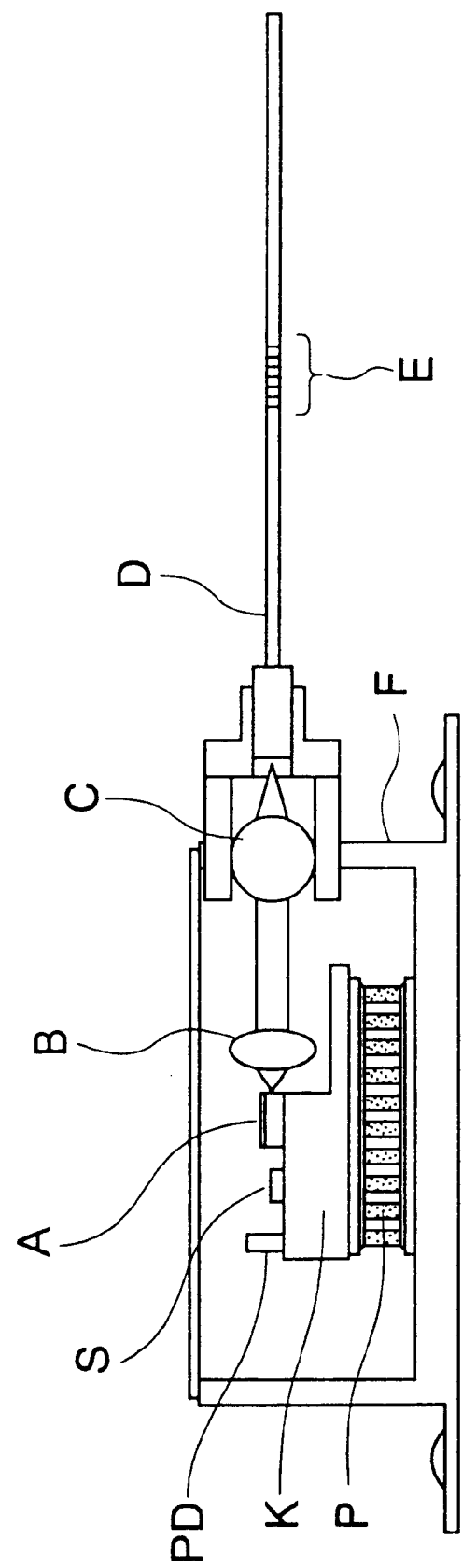
FIG. 5 is an explanatory diagram showing a conventional semiconductor module.
Figure 6:
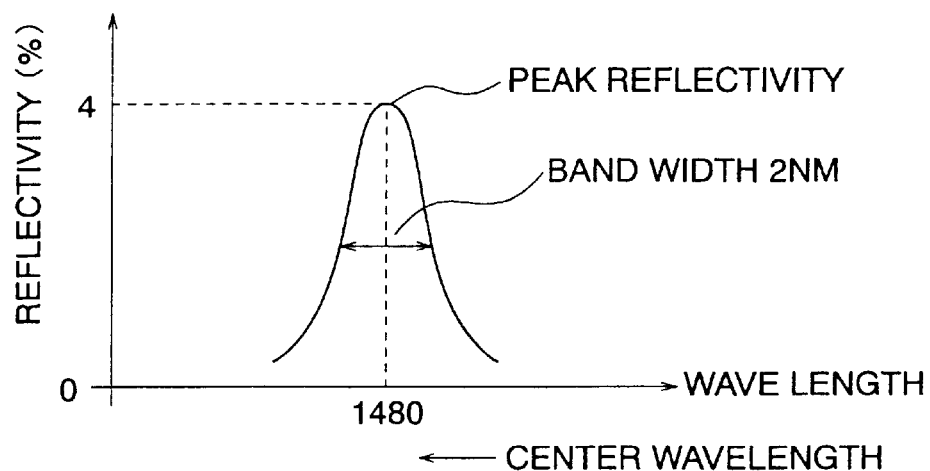
FIG. 6 is an explanatory diagram showing the operation of the semiconductor laser module shown in FIG. 5.

FIG. 4 shows the structure of another embodiment of the Raman amplifier using the semiconductor laser module described in the above-mentioned first and second embodiments as the pumping light source module. In FIG. 4, the Raman amplifier 111 is directed to an optical amplifier of the co-pumping method including a plurality of laser units 101 that output lights different in wavelength, a WDM coupler 102 that wavelength-multiplexes the lights outputted from the laser units 101, an optical fiber 103 that transmits the wavelength-multiplexed lights, and an optical isolator 104 of the polarization independent type which is disposed within the optical fiber 103.

Each of the laser units 101 includes the two semiconductor laser modules 105 described in any one of the above-mentioned respective embodiments, optical fibers 106 that transmits the laser beams outputted from the semiconductor laser modules 105, respectively, a PBC (polarization beam combiner) 112 that polarization-combines those laser beams, an optical fiber that transmits the combined light, and a control section 108 that forms a control means of the present invention.

The above-mentioned plurality of semiconductor laser modules 105 are so set to as to substantially satisfy the above-mentioned required characteristics 1) to 9), and output the laser beams different in wavelength from each other on the basis of the operation control of the semiconductor laser device by the control section 108, for example, the control of an inrush current or a Peltier module temperature.

The optical isolator 104 allows the laser beam outputted from the semiconductor laser module 105 to pass therethrough and cuts the reflection light to the semiconductor laser module 105.

In the Raman amplifier 111 thus structured, after the polarizations of the laser beams outputted from each of the semiconductor laser modules, which are identical in the wavelength and different in the polarization plane, have been combined by the PBC 112 and the degree of polarization has been reduced, the lights different in the wavelength are further combined by the WDM coupler 102, and then inputted into the optical fiber 110 through which the signal light is transmitted, from the optical fiber 103 through the optical isolator 104 and the WDM coupler 109.

The signal light within the optical fiber 110 is transmitted while being Raman-amplified by the inputted laser beam (pumping light).

In the above Raman amplifier 111, the use of the semiconductor laser module 105 and the laser unit 101 according to this embodiment stabilizes the Raman gain wavelength.

(Third Embodiment of the Optical Amplifier)

The optical amplifier according to the above embodiment is directed to the Raman amplifier, but the semiconductor laser module and the laser unit according to the present invention are not limited to the Raman amplifier, but can be used in a rare earth doped fiber amplifier such as an EDFA.

The present invention is not limited to the above-mentioned embodiments, but can be modified within the limit of the subject matter of the present invention.

Effects of the Invention

The semiconductor laser module according to the present invention has the following advantages.

1. Because the oscillation wavelength of the semiconductor laser device is locked by the FBG, the oscillation wavelength is held constant, the pumping optical intensity is stabilized, the Raman gain is stabilized, and the co-pumping can be also used.

2. Since the FBG is formed at a position of the optical fiber inside the protective tube, the FBG is hardly influenced by an external force such as bending, to thereby stabilize the oscillation characteristic.

3. Since the FBG is formed at a position of the optical fiber within the protective tube and also inside the protective boot, the FBG is further hardly influenced by an external force such as bending, to thereby more stabilize the oscillation characteristic.

4. Since the FBG is formed at a portion where no adhesive for fixedly adhering the optical fiber to the ferrule exists, the FBG is not influenced by a stress of the adhesive which occurs duet to a temperature change. For that reason, the reflectivity and the reflection wavelength (center wavelength) of the FBG can be prevented from changing.

Figure 7:
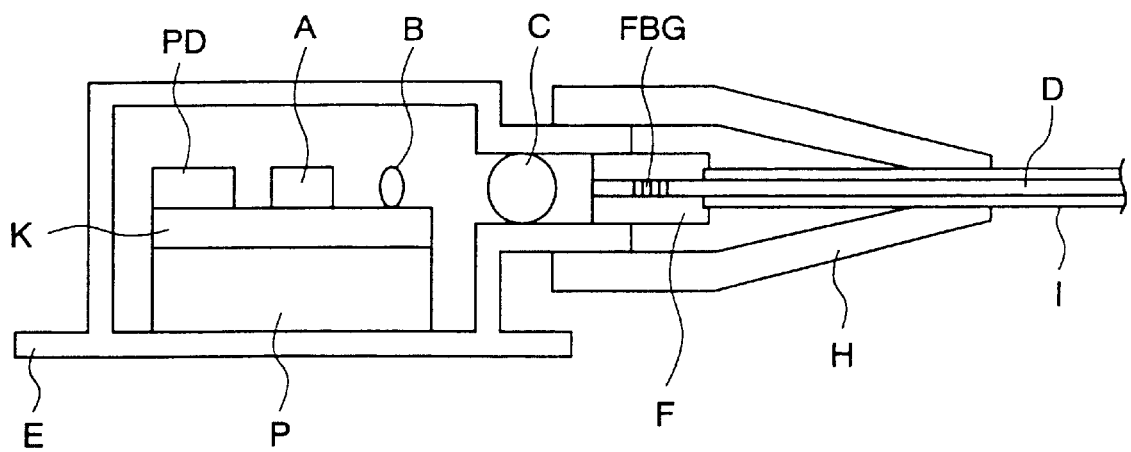
FIG. 7 is an explanatory diagram showing another conventional semiconductor laser module.

5. In the case where the FBG is disposed in the ferrule as shown in FIG. 7, there exists an adhesive for fixedly adhering the optical fiber within the ferrule. The adhesive may be softened or hardened due to a change in the external temperature, and a stress developed due to a change of the adhesive may adversely affect the FBG. In this case, the reflectivity and the reflection wavelength (center wavelength) of the FBG change, thereby making it impossible to obtain a desired wavelength characteristic. In the Raman amplifier using such a semiconductor laser module as a pumping light source, there arises such a problem that the pumping optical wavelength fluctuates, the Raman gain wavelength also fluctuates and the signal optical wavelength also fluctuates. The present invention eliminates such a problem.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor laser module having a ferrule at a light input side leading end of an optical fiber that receives a light outputted from a semiconductor laser device and transmits the light, wherein a fiber grating (FBG) is disposed, outside the ferrule, on the optical fiber inside a protective tube, and a cavity is defined between the FBG and the semiconductor laser device.

2. The semiconductor laser module as claimed in claim 1, wherein the FBG is formed, inside the protective tube, on the optical fiber at a portion where no adhesive exists.

3. An optical amplifier using the semiconductor laser module as claimed in claim 1 as a pumping light source.

4. An optical amplifier using the semiconductor laser module as claimed in claim 2 as a pumping light source.

5. A semiconductor laser module having a ferrule at a light input side leading end of an optical fiber that receives a light outputted from a semiconductor laser device and transmits the light, wherein an FBG is disposed, outside the ferrule, on the optical fiber inside a protective tube that is disposed inside a protective boot, and a cavity is defined between the FBG and the semiconductor laser device.

6. The semiconductor laser module as claimed in claim 5', wherein the FBG is formed, inside the protective tube, on the optical fiber at a portion where no adhesive exists.

7. An optical amplifier using the semiconductor laser module as claimed in claim 5 as a pumping light source.

8. An optical amplifier using the semiconductor laser module as claimed in claim 6 as a pumping light source.

* * * * *